(12) United States Patent
Cohen

(10) Patent No.: US 7,002,229 B2
(45) Date of Patent: Feb. 21, 2006

(54) SELF ALIGNED HALL WITH FIELD PLATE

(75) Inventor: Isaac D. Cohen, Richardson, TX (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/869,336

(22) Filed: Jun. 16, 2004

(65) Prior Publication Data

US 2005/0280107 A1 Dec. 22, 2005

(51) Int. Cl.
*H01L 29/82* (2006.01)
*H01L 43/00* (2006.01)

(52) U.S. Cl. ...................................... 257/426; 257/427
(58) Field of Classification Search ......... 257/421–427
See application file for complete search history.

(56) References Cited

U.S. PATENT DOCUMENTS

| | | | |
|---|---|---|---|
| 4,634,961 A | 1/1987 | Popovic et al. ............. | 323/368 |
| 5,119,166 A | 6/1992 | Sridhar ......................... | 357/60 |
| 5,323,075 A | 6/1994 | Denk et al. ................ | 310/68 B |
| 5,572,058 A | 11/1996 | Biard .......................... | 257/421 |
| 5,627,398 A | 5/1997 | Zlebir et al. ................ | 257/427 |
| 5,742,080 A | 4/1998 | Baranochnikov et al. ... | 257/207 |
| 6,156,596 A | 12/2000 | Jwo ............................ | 438/220 |
| 6,424,018 B1 | 7/2002 | Ohtsuka ..................... | 257/421 |
| 6,492,697 B1 | 12/2002 | Plagens et al. ............. | 257/426 |
| 6,707,293 B1 | 3/2004 | Wan et al. ............. | 324/207.25 |

*Primary Examiner*—Thien F. Tran
(74) *Attorney, Agent, or Firm*—Kris T. Fredrick; Kermit D. Lopez; Luis M. Ortiz

(57) ABSTRACT

A self aligned Hall sensor system and method are disclosed. A substrate can be provided. A Hall element and a plurality of contacts can then be formed upon the substrate wherein contacts are located in reference to one another. A field plate formed from polysilicon can then be formed upon the Hall element, wherein the field plate functions as a self-aligning mask for the plurality of contacts such that when the field plate is biased, a number of mobile carriers present at a surface of the field plate are minimized throughout the surface and up to and including the plurality of contacts, thereby minimizing asymmetry and offsets associated with the Hall element.

11 Claims, 1 Drawing Sheet

SELF ALIGNED HALL WITH FIELD PLATE

TECHNICAL FIELD

Embodiments are generally related to sensing devices. Embodiments are also related to Hall Effect semiconductor devices. Embodiments are further related to self aligned sensing devices.

BACKGROUND OF THE INVENTION

Magnetic sensing devices have many applications, including navigation, position sensing, current sensing, vehicle detection, and rotational displacement. There are many types of magnetic sensors, but essentially they all provide at least one output signal that represents the magnetic field sensed by the device. The Earth, magnets, and electrical currents can all generate magnetic fields. The sensor may be able to detect the presence, the strength, and/or the direction of the magnetic field. The strength of the magnetic field may be represented by a magnitude and a polarity (positive or negative). The direction of the magnetic field may be described by its angular position with respect to the sensor. One of the benefits of using magnetic sensors is that the output of the sensor is generated without the use of contacts. This is a benefit because over time contacts can degrade and cause system failures.

A Hall sensor is a type of magnetic sensor that uses the Hall Effect to detect a magnetic field. The Hall Effect occurs when a current-carrying conductor is placed into a magnetic field. A voltage is generated perpendicular to both the current and the field. The voltage is proportional to the strength of the magnetic field to which it is exposed. The current-carrying conductor is called a Hall element and it is typically composed of a semiconductor material.

Various semiconductor devices have been designed, fabricated and mass-produced utilizing the Hall Effect. For example, Hall Effect switches and the like commonly employ a silicon body through which a bias current is passed between two spaced apart contacts or terminals. Sensing terminals are positioned on opposite sides of the bias current path and exactly located from the two spaced apart bias current input terminals to detect a voltage potential in a direction perpendicular to the bias current path. Ideally, zero potential is developed between the sensing terminals in the absence of a magnetic field.

Hall offset variation generally reduce the performance of magnetic Hall Effect sensors (i.e., "Hall sensors") by increasing the minimum detectable magnetic field. A need thus exists for a device, system and/or method for effectively reducing the offset variation of a Hall sensor from product to product, thereby increasing the signal-to-noise ratio resulting in increasingly sensitive Hall products and devices.

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is, therefore, one aspect of the present invention to provide for improved sensing systems and methods.

It is another aspect of the present invention to provide for an improved Hall Effect semiconductor device.

It is a further aspect of the present invention to provide for a self-aligned Hall sensor system and method.

It is yet a further aspect of the present invention to provide for a Hall sensor system and method in which the offset of a Hall sensor is reduced, thereby increasing signal-to-noise ratio and allowing for increasingly sensitive Hall Effect products.

The aforementioned aspects of the invention and other objectives and advantages can now be achieved as described herein. A self aligned Hall sensor system and method are disclosed. A substrate can be provided. A Hall element and a plurality of contacts can then be formed upon the substrate wherein contacts are located in reference to one another. A field plate can then be formed upon the Hall element with a dielectric between the field plate and the hall element, wherein the field plate functions as a self-aligning mask for the plurality of contacts such that when the field plate is biased, a number of mobile carriers present at a surface of the field plate are minimized throughout the surface and up to and including the plurality of contacts, thereby minimizing variation in the offsets associated with the Hall element.

The field plate can be formed from polysilicon. If the field plate material is polysilicon, mechanical stresses can be reduced because the rate at which the polysilicon expands over temperature is very close to the rate of expansion of the silicon beneath, and therefore the stress created over temperature ranges can be minimized. An epitaxial layer can be formed upon the substrate for supporting the Hall element. The Hall element can be formed from an N-type epitaxial structure constructed utilizing a junction or a dielectric isolation. If a dielectric isolation is utilized, the insulating layer can be configured from a dielectric such as $SiO_2$ or other insulating material. Additionally, a thin insulating layer can be placed over the Hall element. A conductive material such as, for example, polysilicon, can be patterned over the thin insulating layer. The plurality of contacts can be configured to protrude through the conductive material.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate at least one embodiment of the present invention and are not intended to limit the scope of the invention.

Figure 1:
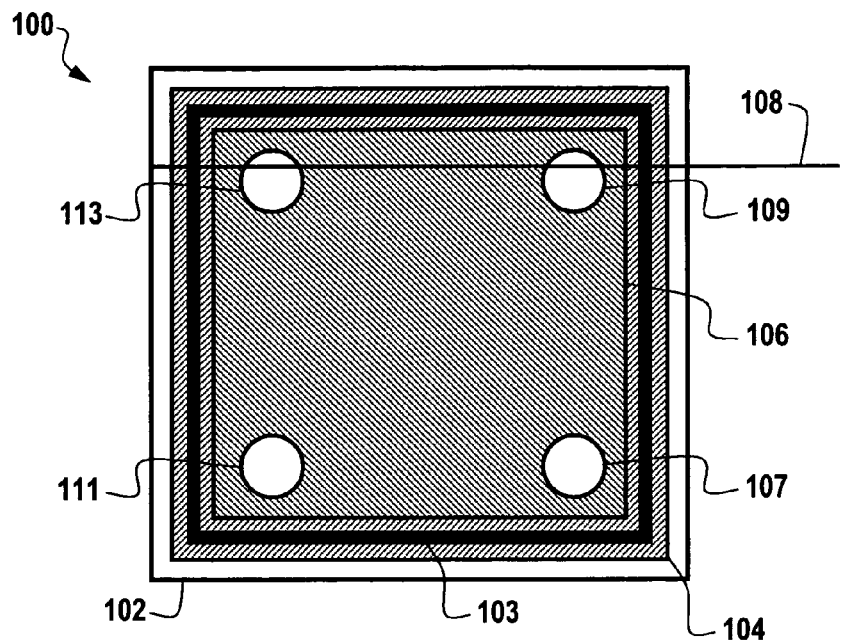
FIG. 1 illustrates a top view of a self-aligned Hall sensing system, which can be implemented in accordance with a preferred embodiment of the present invention.

FIG. 1 illustrates a top view of a self-aligned Hall sensing system 100, which can be implemented in accordance with a preferred embodiment of the present invention. System 100 generally comprises a self-aligned implant 102 and a field plate 104 formed from polysilicon. Field plate 104 thus comprises a polysilicon plate. An isolation ring 103 generally surrounds a thin oxide 106. In turn, a plurality of contacts 107, 109, 111, and 113 protrude through the field plate 104. Contacts 107, 109, 111, and 113 generally constitute self-aligned doping areas. A line 108 is shown in FIG. 1, indicating a cross sectional view, which is depicted in further detail in the configuration of FIG. 2. System 100 thus represents a Hall element, which can be implemented in the context of a Hall Effect sensing system or device. System 100 generally can be configured in a square or rectangular shape. Of course, other shapes (e.g., circular, triangular, and so forth) can also be implemented, depending upon design considerations.

Figure 2:
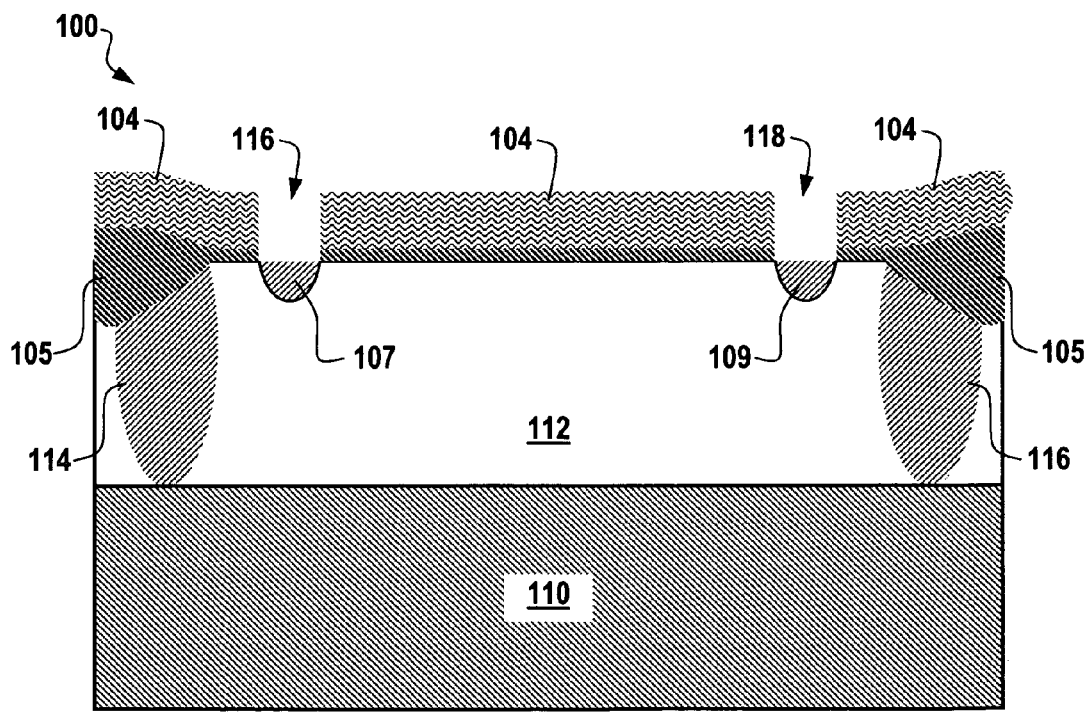
FIG. 2 illustrates a cross-sectional view of the self-aligned Hall sensing system depicted in FIG. 1, in accordance with a preferred embodiment of the present invention.

FIG. 2 illustrates a cross-sectional view of the self-aligned Hall sensing system 100 depicted in FIG. 1, in accordance with a preferred embodiment of the present invention. Note that in FIGS. 1 and 2, identical or similar parts are generally indicated by identical reference numerals. System 100 thus includes a substrate 110, which can be for example, silicon. Epitaxialy grown silicon region 112 can be located above substrate 110. Regions 114 and 116 can be located partially within region 112. A thin insulator 105 can also be located above region 112. The thin insulator 105 functions as a thin insulator between the polysilicon and the hall sensor. Regions 114 and 116 of FIG. 2 essentially refer to the isolation ring 103 depicted in FIG. 1, but because of the cross-sectional view of FIG. 2, regions 114 and 116 (i.e., which constitute isolation ring 103) appear in FIG. 2 as two implants, rather than a single ring. Contacts 107, 109 are also depicted in the cross-section view of system 100 depicted in FIG. 2. Contacts 107 and 109 comprise self-aligned doping areas. Finally, field plate 104 is shown in FIG. 2, wherein field plate 104 comprises polysilicon.

The field plate 104 can thus be placed over the hall element represented by system 100 and therefore functions as a self-aligned mask for the contacts 107, 109, 111, and 113. Such a configuration ensures that the contacts 107, 109, 111, and 113 are all located in reference to one another, thereby removing an alignment step that could introduce variation in the relative locations of the contacts to one another. Such a configuration also ensures that no gaps are present in the field plate 104 between the highly doped contacts 107, 109, 111, and 113 and the effective hall sensor represented by system 100. Thus, when the field plate 104 is biased, the numbers of mobile carriers at the surface of field plate 104 is minimized through the entire surface thereof up to and including contacts 107, 109, 111, and 113.

Therefore, asymmetry and variation of offsets can be further minimized. Additionally if field plate 104 is formed from polysilicon, the mechanical stress can be reduced because the rate at which the polysilicon expands over temperature is very close to the rate of expansion of the silicon (e.g., substrate 110 and/or epitaxialy grown silicon region 112) beneath it and therefore the stress created over variations in temperature can be minimized.

System 100 can thus be configured utilizing a standard self-aligned gate CMOS-type process with an epitaxial layer that could support a Hall element. The Hall element (e.g., system 100) can be configured utilizing an N-type epitaxial tub with either junction or dielectric isolation. Then, a thin insulating layer can be placed over the Hall element and covered with a conductive material, such as, for example, polysilicon. The thin insulating layer can be, for example, a thin dielectric material such as $SiO_2$ or another gate insulator type material. During the patterning of the conductive material, the conductive material can be removed where the contacts 107, 109, 111, and 113 would be located. An implant operation can then be performed over the entire field plate 104 in order to dope the field plate 103 and the contacts 107, 109, 111, and 113 on the epitaxialy grown silicon region 112 in a self-aligned manner. Note that field plate 104, which is formed from polysilicon, can be configured to include holes 116 and 118 for the purposes of doping contacts 107 and 109. Similar holes can also be located through field plate 104 above contacts 111 and 113.

The self aligning features of system 100 disclosed herein allows for much more accurate aligning and masking of the contacts 107, 109, 111, and 113 than would be possible without such self-aligning features. In essence by increasing the accuracy of the manufacturing process, a manufacturer can more consistently create parts in production whether or not the manufacturer consistently possesses an offset of, for example, "0", or an actual built-in offset by design. Although the preferred embodiment of FIG. 1 refers to a symmetrical design (i.e., the symmetry of contacts 107, 109, 111, and 113), it can be appreciated that an alternative embodiment can be implemented, which is asymmetrical in nature, but which minimizes part to part variation in the offsets associated with the Hall element.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered.

The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

What is claimed is:

1. A self aligned Hall sensor system, comprising:
a substrate;
a Hall element and a plurality of contacts formed upon said substrate wherein each contact among said plurality of contacts are located in reference to one another; and
a field plate formed upon said Hall element, wherein said field plate functions as a self-aligning mask for said plurality of contacts.

2. The system of claim 1 wherein each contact among said plurality of contacts are located in reference to one another, thereby minimizing asymmetry associated with said Hall element.

3. The system of claim 1 wherein said field plate comprises a polysilicon.

4. The system of claim 1 further comprising an epitaxial layer formed upon said substrate for supporting said Hall element.

5. The system of claim 4 wherein said Hall element comprises an N-type epitaxial structure constructed utilizing a junction isolation.

6. The system of claim 4 wherein said Hall element comprises an N-type epitaxial structure constructed utilizing a dielectric isolation.

7. The system of claim 4 further comprising a thin insulating layer placed over said Hall element.

8. The system of claim 7 wherein a conductive material is patterned over said thin insulating layer.

9. The system of claim 8 wherein said conductive material comprises polysilicon.

10. The system of claim 8 wherein said plurality of contacts is configured to protrude through said conductive material.

11. A self aligned Hall sensor system, comprising:
a substrate comprising silicon;
a Hall element and a plurality of contacts formed upon said substrate wherein each contact among said plurality of contacts are located in reference to one another;
an epitaxial layer formed upon said substrate for supporting said Hall element;
an insulating layer placed over said Hall element;
a conductive material is patterned over said insulating layer, wherein said conductive material comprises a polysilicon; and
a field plate comprising polysilicon, wherein said field plate is formed upon said Hall element, such that said field plate functions as a self-aligning mask for said plurality of contacts such that when said field plate is biased, a number of mobile carriers present at a surface of said field plate are minimized throughout said surface and up to and including said plurality of contacts, thereby minimizing variation in offsets associated with said Hall element.

* * * * *